United States Patent [19]

Kunihiro

[11] Patent Number: 5,742,093

[45] Date of Patent: Apr. 21, 1998

[54] FREQUENCY COMPENSATOR

[75] Inventor: Kazuaki Kunihiro, Tokyo, Japan

[73] Assignee: NEC Corporation, Tokyo, Japan

[21] Appl. No.: 673,821

[22] Filed: Jun. 27, 1996

[30] Foreign Application Priority Data

Jun. 30, 1995 [JP] Japan .................................. 7-188307

[51] Int. Cl.$^6$ ................................................. H01L 29/167
[52] U.S. Cl. .......................................... 257/610; 257/379
[58] Field of Search .............................. 257/610, 272, 257/379, 476, 533

[56] References Cited

U.S. PATENT DOCUMENTS 5,355,014  10/1994  Rao et al. ............................. 257/476

OTHER PUBLICATIONS

Shun-ichi Fujikawa, *High-Performance Pulse Pattern Generator, Multi-Channel Data Generator with GaAs FET Essential for Development of Super-High Speed Digital Devices*, JEE, Sep. 1996, pp. 50–54.

Kohei Ono et al., *3G, 5G, and 10Gb/s Ultra-Highspeed Error Rate Measuring Equipment*, No. 61, Apr., 1991, pp. 50–61.

*Primary Examiner*—Mark V. Prenty
*Attorney, Agent, or Firm*—Ostrolenk, Faber, Gerb & Soffen, LLP

[57] ABSTRACT

A frequency compensator is disposed as a stage preceding an inverter or a source follower constituted by a compound semiconductor FET, and it has a node A, at which an input signal is divided by resistances, and a node B, at which the input signal is divided by capacitances. The two nodes A and B are connected to each other via a diode such that the diode is biased forward when the node A is biased positively with respect to the node B. The node B is connected to the input of the FET. The diode has a barrier height substantially equal to the activation energy in a deep level trap contained in crystal constituting the FET.

7 Claims, 6 Drawing Sheets

FREQUENCY COMPENSATOR

BACKGROUND OF THE INVENTION

The present invention relates to a frequency compensator and, more particularly, to a frequency compensator for inverters and source followers circuits.

It is well known in the art that a MESFET (Metal Semiconductor FET) or a HJFET (Heterojunction FET) formed on a semi-insulating substrate of gallium arsenide GaAs is subject to current lag and frequency dispersion due to the deep level trap in the substrate. These phenomena give rise to pulse width variations in digital ICs, gain variations in wide-band amplifiers (see FIG. 6), etc., which is a practical problem in GaAs FETs. Heretofore, a frequency compensator comprising a resistance and a capacitance has been provided to solve the above problem.

FIG. 5 shows an example of the pertinent prior art structure. Referring to FIG. 5, a compensator comprising resistors 52 and 53 and a capacitor 51 are provided on the input side of an inverting amplifier comprising an FET 50 with a resistor 54 as a load. The capacitance of the capacitor 51 and the resistances of the resistors 52 and 53 are selected such that the compensator has a frequency characteristic to cancel the frequency dispersion in the FET 50. The above prior art compensator constituted by the resistance and capacitance, however, has had a problem in that it cannot accurately compensate for variations when it is in large signal operation, although it can accurately compensate for small signal variations. This is so because of the fact that the time constants of carrier capturing and emission in a deep level trap in crystal that brings about FET characteristics variations are different in the case of large signal operation and in the case of small signal operation.

Specifically, when the FET is in large signal operation, the carrier capturing process has a time constant which is faster by a number of digits than in the carrier emission process. This means that the characteristics variations of the FET are different depending on the direction and amplitude of input signal bias changes. With the above prior art compensator constituted by the resistance and capacitance, it has been possible to determine only a single time constant that is determined by the product of the capacitance and capacitance, and it has been impossible to obtain accurate vibration correction when the FET is in large signal operation. It has been well known that the frequency characteristics of the FET are temperature-dependent due to the nature of traps (see FIG. 6). With the above prior art compensator, however, it has been possible to obtain compensation only with respect to a certain predetermined temperature, so that it has been necessary to set the resistance and capacitance afresh for a different temperature.

SUMMARY OF THE INVENTION

An object of the present invention is therefore to provide a frequency compensator, which can solve the above problems and can accurately compensate for frequency dispersion which is peculiar to the compound semiconductor FET irrespective of the input signal amplitude or ambient temperature.

According to the present invention, there is provided a frequency compensator provided as a stage preceding a semiconductor circuit which is subject to frequncy variation due to deep level trap, comprising a first node, at which an input signal is divided by resistances, and a second node, at which the input signal is divided by capacitances, the first and second nodes being connected to each other via a diode such that the diode is biased forward when the first node is biased positively with respect to the second node, the second node being connected to the input side of the semiconductor circuit. The diode is a Schottky diode, the semiconductor circuit is an inverter or a source follower circuit constituted by a compound semiconductor FET, and the diode is such that the barrier height thereof with respect to electrons is substantially the same as the activation energy of a deep level trapcontained in crystal constituting the FET.

According to another aspect of the present invention, there is provided a frequency compensator provided as a stage preceding a semiconductor circuit which is subject to frequency variation due to deep level trap and connected to an input side of the semiconductor circuit via a diode, the diode being constructed such that it is biased forward when capturing of carriers is taking place in the charge trap in the substrate and biased reversely when emission of carriers is taking plate in the chaege trap, frequency characteristics variations of the compound semiconductor FET being compensated for in large signal operation as well. The diode has a barrier height close to the activation energy of the charge trap for compensating the charge trap response changes with temperature. The semiconductor circuit is an inverter or a source follower circuit constituted by a compound semiconductor FET.

Other objects and features will be apparent from the following description with reference to the attached drawings.

PREFERRED EMBODIMENTS OF THE INVENTION

It has been well known that frequency variations in the FET are caused by deep level trap which is present in the semi-insulating substrate or the interface between an epitaxial layer and the substrate. The carrier capturing/emission due to the deep impurity energy level (charge trap) can be approximated by SRH (Schokley Read Hall) statistics as shown by the following equation (1).

$$\frac{d\Delta Q_B}{dt} = -J_B \left\{ \exp\left(\frac{e\Delta Q_B}{C_B k_B T}\right) - 1 \right\} - \frac{\Delta Q_B}{R_B C_B} \quad (1)$$

where $\Delta Q_B$ is the trap-charge deviation (in C/cm$^2$), $k_B$ is the Boltzmann's constant (in J/K), T is the temperature (in K), and e is the electron charge (in C). $(R_B C_B)^{-1}$ corresponds to the deep trap response time. Equation (1) represents that the trap-charge change due to the carrier capturing/emission, can be represented by the current that flows through the diode and resistance. The difference between the time constants of the capturing and emission of carriers, is expressed by making use of the rectifying property of the diode.

Accurate FET characteristics variation compensation, can be obtained in large signal operation by the provision of an input compensator, which biases the diode forwardly when carriers are being captured in the deep trap in the substrate and biases the diode reversely when carriers are being emitted. The saturation current density JB in the diode in equation (1), can be expressed as a function of the temperature by using physical property parameters of the deep trap as follows.

$$J_B = eN_{DD}f_{TO}\gamma_n\sigma_n T^2 \exp\left(-\frac{\Delta E_a}{k_B T}\right) \quad (2)$$

where $N_{DD}$ is the trap density (in $cm^{-2}$), $f_{TO}$ is the electron occupancy ratio for deep traps in DC, $\gamma_n$ is a constant determined by material (in $cm^{-2}s^{-1}K^{-2}$), $\sigma_n$ is the electron capture cross section (in $cm^2$), and $\Delta E_a$ is the trap activation energy (in eV).

Equation (2) expresses the barrier height with respect to electrons in the form of the trap activation energy that is expressed as the Schottky diode current due to the thermionic emission. This means that trap response variations with temperature can be compensated for by using a diode, which has a barrier height close to the trap activation energy. According to the present invention, a node, at which the input signal is divided by capacitances to a certain value when it is a high frequency signal, and another node, at which the input signal is divided by resistances to a certain different value when it is a DC signal, are provided, these nodes being connected to each other via a diode such that the diode is biased forward when the resistance-coupled node is biased poisitively, thus permitting automatic frequency viariation compensation for temperature changes by utilizing the temperature dependency of diode characteristicas.

Figure 1:
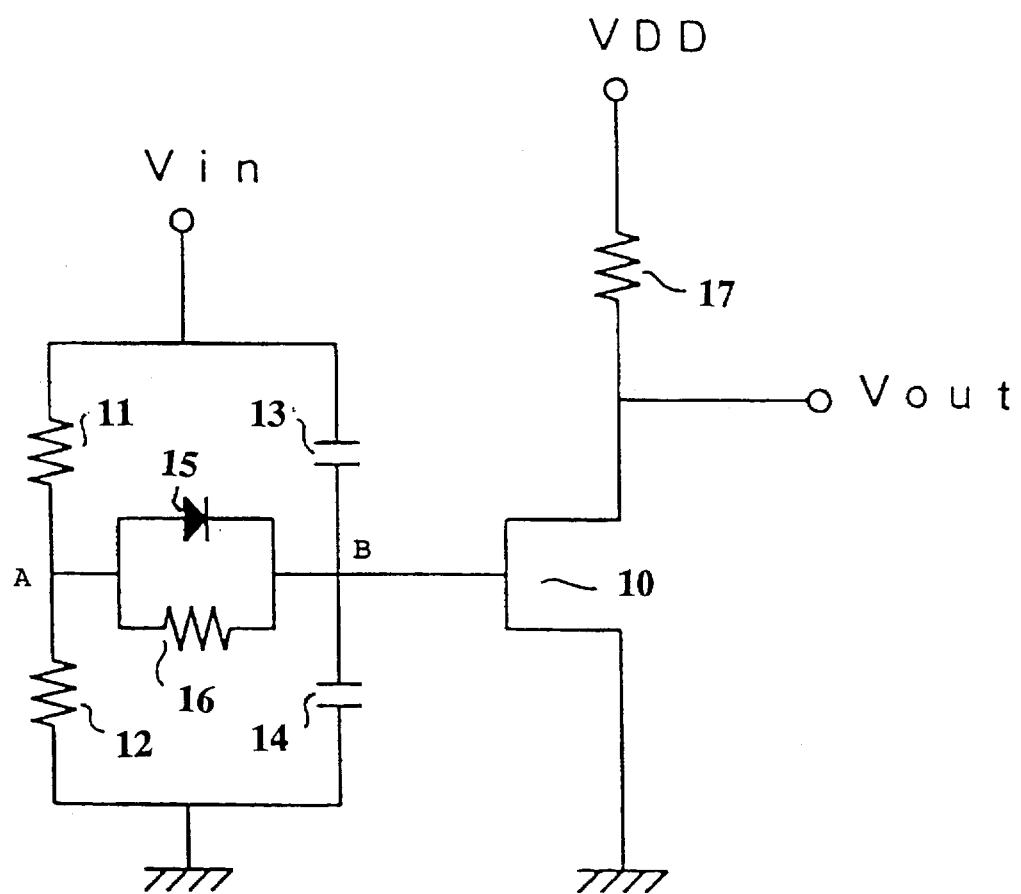
FIG. 1 shows an example of the structure according to the present invention applied to an HJFET inverting amplifier with MBE (Molecular Beam Epitaxy) formed on a GaAs semi-insulating LEC (liquid encapsulated Czochralski) substrate.

FIG. 1 shows an example of the structure according to the present invention applied to an HJFET inverting amplifier formed on a GaAs semi-insulating LEC (Liquid Encapsulated Czochralski) substrate with MBE (Molecular Beam Epitaxy). With the circuit construction as shown in FIG. 1, the input voltage to the FET 10 is determined by the resistance coupling between the resistors 11 and 12 when the input signal is a DC signal, and it is determined by the capacitance coupling between the capacitors 13 and 14 when the input signal is a high frequency signal.

The resistance and capacitance values are set such that the node B is made to be at a higher potential than at the node A when the input signal Vin is brought from low level to high level. At this time, the change from the high frequency state to DC takes place relatively slowly because of a reverse current caused through the diode 15 from the node B to the node A. When Vin is brought from high level to low level, relatively fast change is brought about due to the forward current caused through the diode 15 from the node A to the node B. The time constant difference can be determined such that it corresponds to the difference between the time constants of the electron emission and capturing in the trap in the substrate.

Specific compensator parameters are as follows.

| | |
|---|---|
| R(11) | 250 kΩ |
| R(12) | 750 kΩ |
| C(13) | 1.5 nF |
| IB(15) | 2 × 10⁻¹¹ A (=20 pA) (diode width 100 μm) |

While in the above parameters the resitance R(16) and capacitance C(14) shown in FIG. 1 are omitted, the features of the present embodiment are maintained (such that the compensator functions as a frequency compensator).

In this embodiment, the diode 15 is a Schottky diode formed monolithically on the GaAs substrate, and the Schottky diode is formed with Au/alpha Ni—Nb alloy. In this case, the Schottky barrier height is about 0.5 eV, which is close to an activation energy level of 0.4 eV of oxygen impurity that is frequently observed with MBE substrate. Where a MOCVD substrate is used or with an ion implantation MESFET, the EL2 level in the LEC substrate (acctivation energy: 0.82 eV) is important. In this case, correct temperature compensation can be obtained by using Ti or Ti/Pt for the Schottky electrode.

Figure 2:
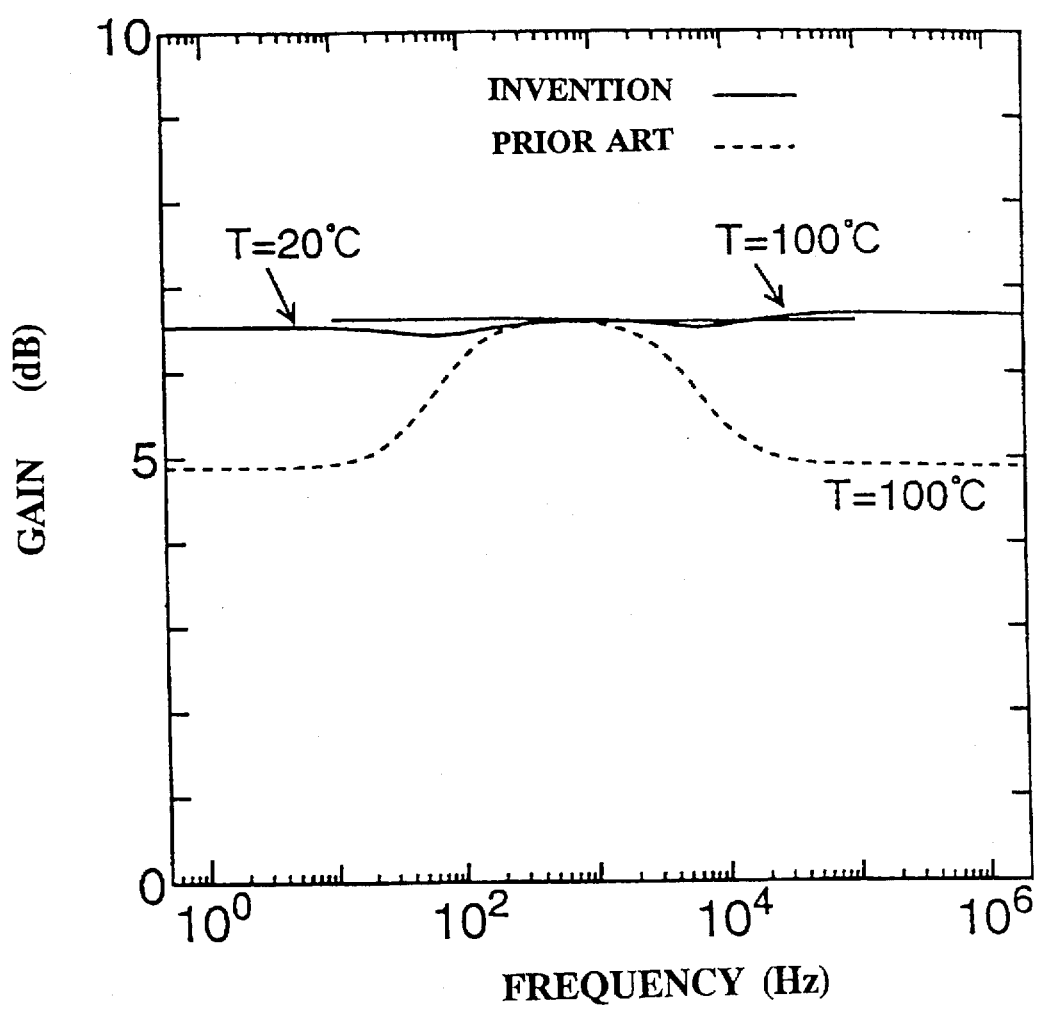
FIG. 2 shows compensation for the frequency dispersion of the inverting amplifier gain obtained with this embodiment of the compensator.

FIG. 2 shows compensation for the frequency dispersion of the inverting amplifier gain obtained with this embodiment of the compensator. Referring to FIG. 2, in this embodiment the gain variations are compensated for both at 20° C. and at 100° C. The broken curve shows compensation obtained with the prior art compensator at 20° C. Although the above prior art compensator permits entirely the same compensator effects as obtainable with this embodiment to be obtained at 20° C., when the temperature is increased to 100° C., the compensation frequency of the compensator and the inverting amplifier gain variation frequency are deviated from each other, so that the compensator no longer functions as the frequency compensator.

Figure 3:
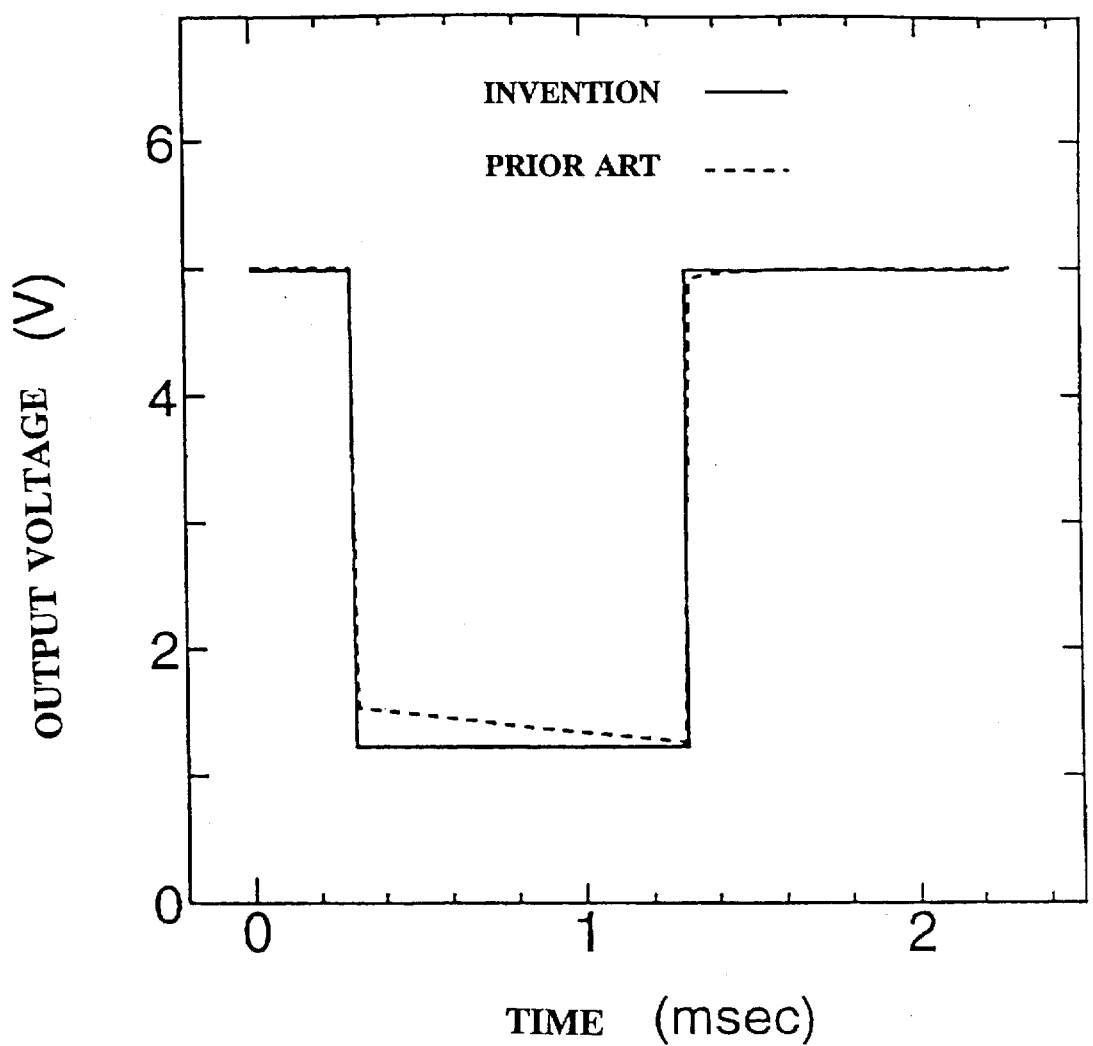
FIG. 3 is a view for describing the functions and effects of this embodiment.

FIG. 3 is a drawing for describing the functions and effects of this embodiment. Specifically, FIG. 3 shows the output voltage Vin of the same inverting amplifier as of FIG. 2 when a pulse is inputted as input Vin at a temperature of 20° C. It is obvious from FIG. 3 that, although the prior art compensator permits the small signal gain compensation at 20° C., the large signal input pulse results in output pulse distortion and hence cannot be perfectly compenated for.

Figure 4:
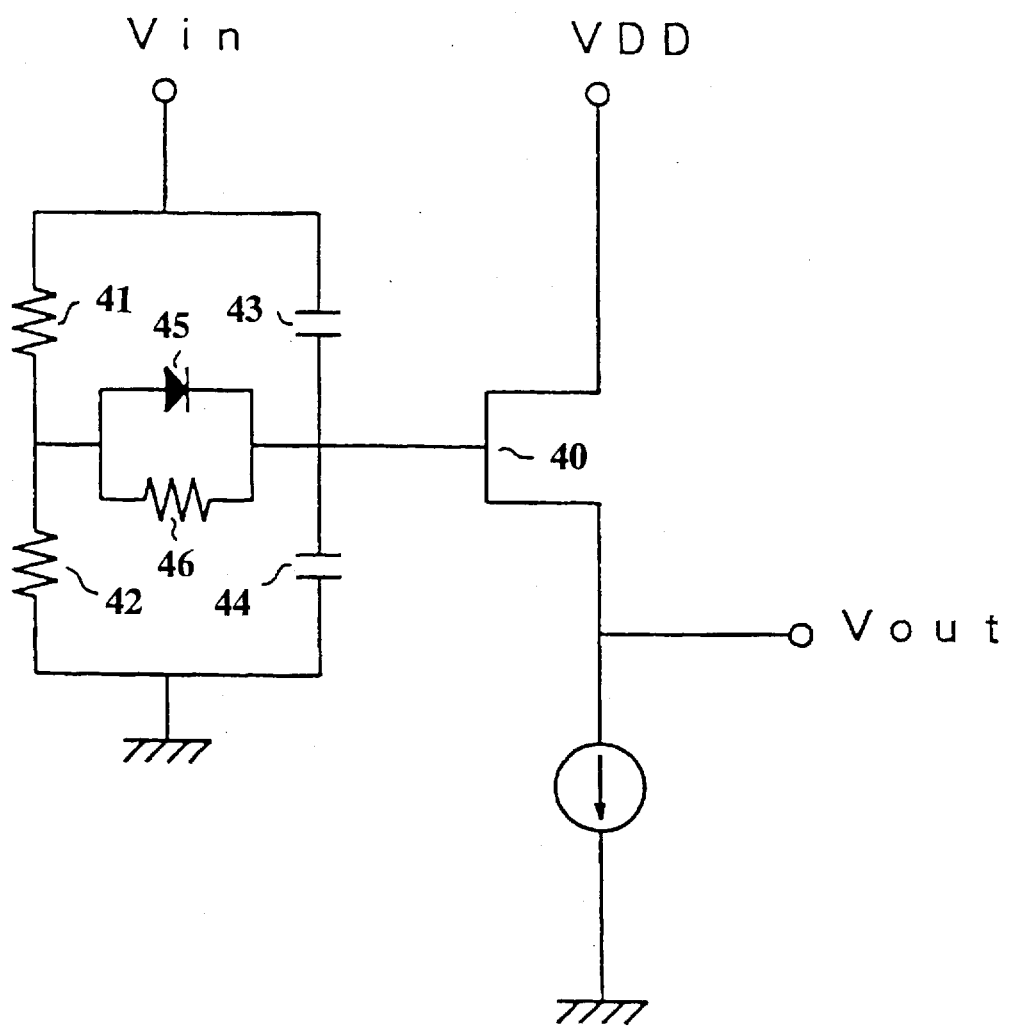
FIG. 4 shows the structure of a second embodiment of the present invention.
Figure 5:
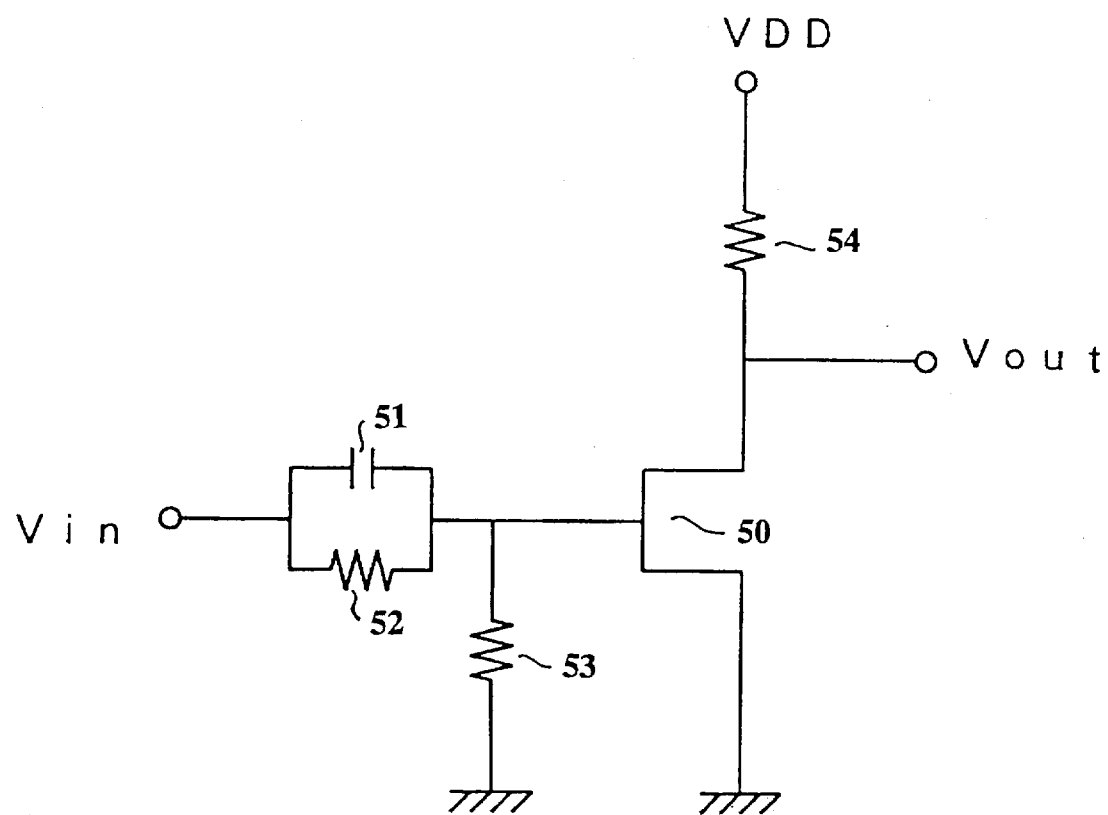
FIG. 5 shows an example of the pertaining prior art structure.
Figure 6:
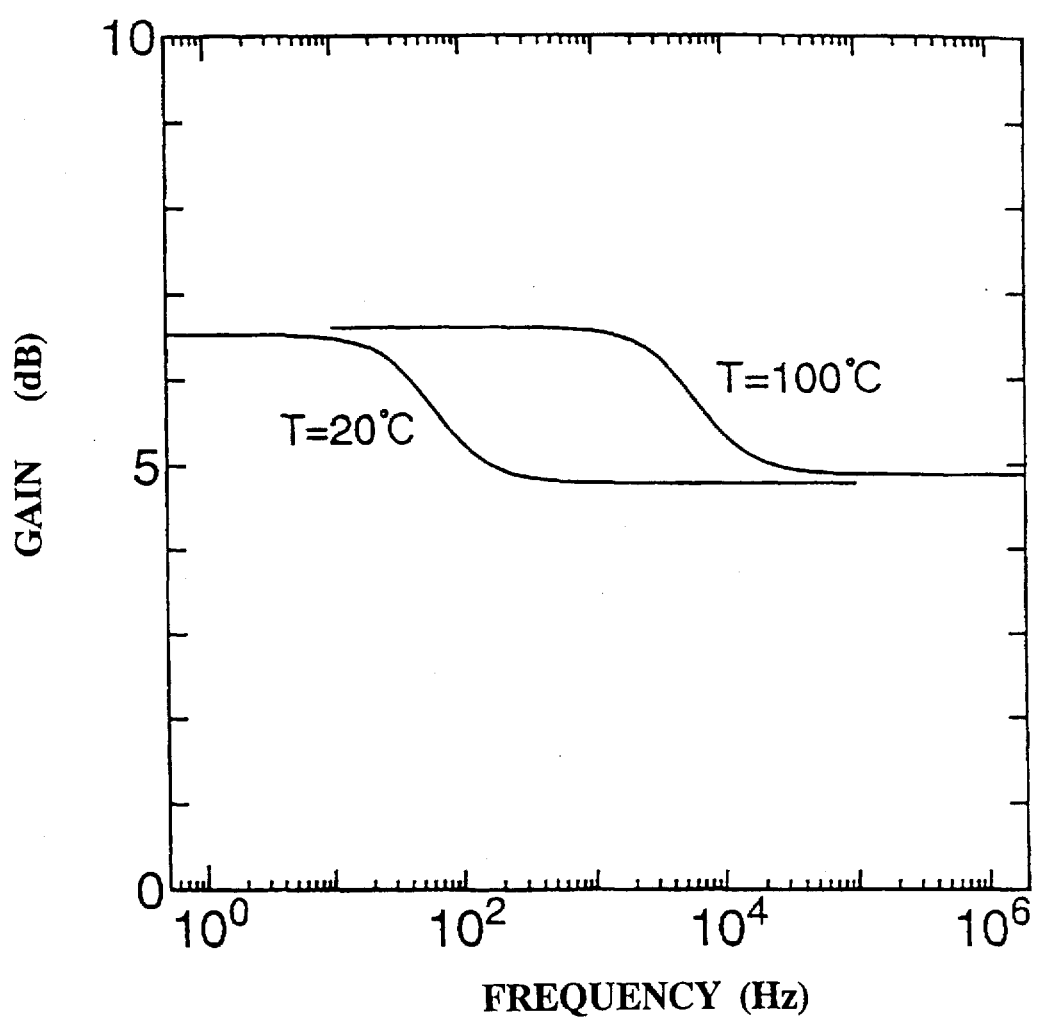
FIG. 6 shows a temperature-dependent frequency characteristics of the FET.

FIG. 4 shows a structure of a second embodiment of the present invention. In this embodiment, the present invention is applied to a source follower circuit. Specifically, a frequency compensator embodying the present invention is provided on the input side of an FET 40 of a switch for frequency variation compensation. The present invention is not limited to the compound semiconductor FET, and is applicable to general device which is subject to frequency variations due to deep level trap. For example, it is predicted that similar problems to those discussed above are posed by SOI (Silicon on Insulator), and the present invention is effective for such case.

While some preferred embodiments of the present invention have been described, these embodiments are by no means limiting, and the present invention of course covers various changes and modifications underlying its principles.

As has been described in the foregoing, according to the present invention a node, at which the input signal is divided by capacitances to a certain value when it is a high frequency signal, and another node, at which the input signal is divided by resistances to a certain different value when it is a DC signal, are provided, these nodes being connected to each other via a diode such that the diode is biased forward when the resistance-coupled node is biased positively, thus permitting automatic frequency variation compensation for temperature changes by utilizing the temperature dependency of diode characteristics. It is thus possible to permit compensation of the frequency dispersion peculiar to compound semiconductor FETs irrespective of the input signal amplitude or ambient temperature.

What is claimed:

1. A frequency compensator provided as a stage preceding a semiconductor circuit which is subject to frequency variation due to deep level trap, comprising a first node, at which an input signal is divided by resistances, and a second node, at which the input signal is divided by capacitances, the first and second nodes being connected to each other via a diode such that the diode is biased forward when the first node is biased positively with respect to the second node, the second node being connected to the input side of the semiconductor circuit.

2. The frequency compensator according to claim 1, wherein the diode is a Schottky diode.

3. The frequency compensator according to claim 1, wherein the semiconductor circuit is an inverter or a source follower circuit constituted by a compound semiconductor FET.

4. The frequency compensator according to claim 3, wherein the diode is such that the barrier height thereof with respect to electrons is substantially the same as the activation energy of a deep level trap contained in crystal constituting the FET.

5. A frequency compensator provided as a stage preceding a semiconductor circuit, the semiconductor circuit including a substrate having a charge trap and the semiconductor circuit being subject to frequency variation due to deep level trap, the frequency compensator being connected to an input side of the semiconductor circuit via a diode, the diode being constructed such that it is forward biased when carrier capturing takes place in the charge trap, and reverse biased when carrier emission takes place in the charge trap.

6. The frequency compensator according to claim 5, wherein the diode has a barrier height close to the activation energy of the charge trap for compensating charge trap response changes with temperature.

7. The frequency compensator according to claim 5, wherein the semiconductor circuit is an inverter or a source follower circuit comprising a compound semiconductor FET.

\* \* \* \* \*